(12) United States Patent
Jang et al.

(10) Patent No.: US 7,863,737 B2
(45) Date of Patent: Jan. 4, 2011

(54) INTEGRATED CIRCUIT PACKAGE SYSTEM WITH WIRE BOND PATTERN

(75) Inventors: Byoung Wook Jang, Seoul (KR); Hun Teak Lee, Ichon (KR); Kwang Soon Hwang, Seoul (KR)

(73) Assignee: Stats Chippac Ltd., Singapore (SG)

( * ) Notice: Subject to any disclaimer, the term of this patent is extended or adjusted under 35 U.S.C. 154(b) by 784 days.

(21) Appl. No.: 11/278,414

(22) Filed: Apr. 1, 2006

(65) Prior Publication Data

US 2007/0235869 A1    Oct. 11, 2007

(51) Int. Cl.
    *H01L 23/48*    (2006.01)
(52) U.S. Cl. .................. 257/734; 257/182; 257/735; 257/736; 257/737; 257/203; 257/665; 257/666; 257/667; 257/668; 257/669; 257/670; 257/671; 257/672; 257/673; 257/674; 257/E21.506; 257/E23.014; 257/E23.015; 257/E23.031; 257/E23.048; 257/E23.061; 438/123; 438/460; 438/461; 438/462; 438/463; 438/464; 438/465
(58) Field of Classification Search .................. 257/734
    See application file for complete search history.

(56) References Cited

U.S. PATENT DOCUMENTS

| | | | | |
|---|---|---|---|---|
| 5,198,888 | A * | 3/1993 | Sugano et al. ............. | 257/686 |
| 5,215,940 | A | 6/1993 | Orcutt et al. | |
| 5,530,281 | A | 6/1996 | Groover et al. | |
| 5,530,287 | A | 6/1996 | Currie et al. | |
| 5,557,143 | A * | 9/1996 | Seiji ........................... | 257/666 |
| 5,569,964 | A * | 10/1996 | Ikebe ......................... | 257/780 |
| 5,608,265 | A * | 3/1997 | Kitano et al. ............... | 257/738 |
| 5,767,527 | A * | 6/1998 | Yoneda et al. ............... | 257/48 |
| 5,811,880 | A * | 9/1998 | Banerjee et al. ............ | 257/724 |
| 5,895,977 | A * | 4/1999 | Banerjee ..................... | 257/786 |
| 5,965,948 | A * | 10/1999 | Okamoto .................... | 257/786 |
| 5,994,768 | A * | 11/1999 | Fogelson .................... | 257/666 |
| 6,005,293 | A * | 12/1999 | Mori ........................... | 257/784 |
| 6,008,532 | A * | 12/1999 | Carichner ................... | 257/691 |
| 6,037,669 | A * | 3/2000 | Shu et al. .................... | 257/786 |
| 6,066,888 | A * | 5/2000 | Yanagisawa ................ | 257/668 |
| 6,084,300 | A * | 7/2000 | Oka ............................ | 257/730 |
| 6,098,868 | A * | 8/2000 | Mae et al. ................... | 228/102 |
| 6,214,638 | B1 * | 4/2001 | Banerjee ..................... | 438/106 |
| 6,222,738 | B1 * | 4/2001 | Maeno et al. .............. | 361/772 |
| 6,268,646 | B1 * | 7/2001 | Sugimoto et al. .......... | 257/673 |
| 6,420,651 | B1 * | 7/2002 | Barrow ....................... | 174/538 |
| 6,424,050 | B1 * | 7/2002 | Komiyama ................. | 257/777 |
| 6,429,528 | B1 * | 8/2002 | King et al. .................. | 257/775 |
| 6,531,762 | B1 * | 3/2003 | Liao et al. ................... | 257/666 |
| 6,538,336 | B1 * | 3/2003 | Secker et al. ................ | 257/786 |
| 6,566,168 | B2 * | 5/2003 | Gang .......................... | 438/112 |
| 6,686,651 | B1 * | 2/2004 | Foster ......................... | 257/666 |
| 6,713,881 | B2 * | 3/2004 | Umehara et al. ............ | 257/786 |
| 6,841,852 | B2 * | 1/2005 | Luo et al. .................... | 257/666 |
| 6,933,593 | B2 * | 8/2005 | Fissore et al. ............... | 257/675 |
| 6,951,982 | B2 * | 10/2005 | Chye et al. .................. | 174/350 |
| 6,956,290 | B2 * | 10/2005 | Matsuda ..................... | 257/777 |
| 6,979,886 | B2 * | 12/2005 | Hung et al. ................. | 257/666 |
| 7,053,485 | B2 * | 5/2006 | Bang et al. .................. | 257/730 |

(Continued)

*Primary Examiner*—Fernando L Toledo
*Assistant Examiner*—Ankush k Singal
(74) *Attorney, Agent, or Firm*—Mikio Ishimaru

(57) ABSTRACT

An integrated circuit package system including providing a plurality of substantially identical package leads formed in a single row, and attaching bond wires having an offset on adjacent locations of the package leads.

20 Claims, 2 Drawing Sheets

U.S. PATENT DOCUMENTS

| | | | |
|---|---|---|---|
| 7,160,759 B2* | 1/2007 | Ito et al. | 438/123 |
| 7,165,316 B2* | 1/2007 | Fjelstad | 29/620 |
| 7,208,817 B2* | 4/2007 | Ito et al. | 257/666 |
| 7,211,879 B1* | 5/2007 | Yang et al | 257/666 |
| 7,211,884 B1* | 5/2007 | Davis et al. | 257/685 |
| 7,211,900 B2* | 5/2007 | Shin et al | 257/777 |
| 7,408,242 B2* | 8/2008 | Yamanaka et al. | 257/666 |
| 2001/0000053 A1* | 3/2001 | Suh et al. | 257/686 |
| 2001/0011768 A1* | 8/2001 | Kohara et al. | 257/692 |
| 2001/0013662 A1* | 8/2001 | Kudou et al. | 257/784 |
| 2002/0030266 A1* | 3/2002 | Murata | 257/698 |
| 2002/0093082 A1* | 7/2002 | Miyamoto et al. | 257/678 |
| 2002/0125584 A1* | 9/2002 | Umehara et al. | 257/786 |
| 2002/0195697 A1* | 12/2002 | Mess et al. | 257/686 |
| 2003/0011038 A1* | 1/2003 | Kida | 257/459 |
| 2003/0042581 A1* | 3/2003 | Fee et al. | 257/666 |
| 2003/0111717 A1* | 6/2003 | Ito et al. | 257/678 |
| 2003/0137042 A1* | 7/2003 | Mess et al. | 257/686 |
| 2003/0153099 A1* | 8/2003 | Jiang et al. | 438/1 |
| 2003/0228720 A1* | 12/2003 | Ito et al. | 438/124 |
| 2004/0027869 A1* | 2/2004 | Miwa et al. | 365/199 |
| 2004/0100772 A1* | 5/2004 | Chye et al. | 361/702 |
| 2004/0195703 A1* | 10/2004 | Lane et al. | 257/784 |
| 2004/0232528 A1* | 11/2004 | Ito et al. | 257/666 |
| 2005/0023655 A1* | 2/2005 | Fee et al. | 257/676 |
| 2005/0029645 A1* | 2/2005 | Mess et al. | 257/686 |
| 2005/0184365 A1* | 8/2005 | Lien | 257/666 |
| 2005/0285241 A1* | 12/2005 | Fee et al. | 257/676 |
| 2006/0043609 A1* | 3/2006 | Brennan et al. | 257/784 |
| 2006/0186528 A1* | 8/2006 | Sasaki et al. | 257/690 |
| 2006/0192300 A1* | 8/2006 | Appel et al. | 257/784 |
| 2006/0211307 A1* | 9/2006 | Ueno et al. | 439/660 |
| 2006/0240600 A1* | 10/2006 | Ito et al. | 438/123 |
| 2007/0040247 A1* | 2/2007 | Lee et al. | 257/666 |
| 2007/0065987 A1* | 3/2007 | Mess et al. | 438/109 |
| 2007/0210422 A1* | 9/2007 | Chow et al. | 257/666 |

* cited by examiner

INTEGRATED CIRCUIT PACKAGE SYSTEM WITH WIRE BOND PATTERN

TECHNICAL FIELD

The present invention relates generally to package systems, and more particularly to a system for an integrated circuit package.

BACKGROUND ART

The advent of integrated circuitry has given rise to the need for integrated circuit packages that will both house and protect the integrated circuit die. These integrated circuit packages provide a mechanism for making electrical interconnection between the circuits on the integrated circuit die and the leads that are utilized to make electrical interconnections to circuits, power, and ground external to the integrated circuit die. In the early stages of development of integrated circuits, there were relatively few connections between the integrated circuit die and the external circuitry.

As integrated circuit packages provide electrical interconnection of integrated circuits to an electronic system at a next level of integration or hierarchy, a leadframe is one common means of electrical interconnection. The leadframe is formed from electrically conductive material, which is formed into leads. The lead ends are electrically connected to the integrated circuit die and the next level electronic system including external circuitry such as a printed circuit board. The leadframe also often include a die attach paddle to mount the integrated circuit die.

For those early types of integrated circuits, the interconnection to the integrated circuit package was relatively straightforward and generally involved an array of leads arranged around a die cavity to be electrically connected to associated die pads. There were also relatively few circuits on each integrated circuit die, and the circuit operational rates were by modern day standards relatively slow. Accordingly, the spacing and configuration of the leads with respect to the die pads was relatively less important in the consideration of the length of interconnection conductors and the degree of difficulty of reliable assembly.

Across virtually all applications, there continues to be growing demand for reducing size and increasing performance of integrated circuits. The seemingly ceaseless constrictions in requirement are no more visible than with products in our daily lives. Smaller and denser integrated circuits are required in many portable electronic products, such as cell phones, portable computers, voice recorders, etc. as well as in many larger electronic systems, such as cars, planes, industrial control systems, etc. As the demand grows for smaller electronic products with more features, manufacturers are seeking ways to reduce the size of the packaged integrated circuits. To meet these needs, packaging technologies are increasingly using smaller area designs with smaller features.

As the integrated circuit technology advanced, more circuit cells were able to be fabricated in a similar die area so that substantially increased functionality could be accomplished on a given integrated circuit die. The added functionality and increase in the number of circuits involved generally required a larger number of discrete connections to the associated external circuitry. As physical sizes decreased and the number of required die pads increased, it was necessary to develop integrated circuit packages that would accommodate connections to a larger number of leads. Both integrated circuit users and integrated package manufacturers worked to develop die interconnect systems that would accommodate the higher die pad densities.

Lead systems provide the connection of an integrated circuit chip to a next level system, such as a circuit board or an electronic device. These external connections cannot be made directly to an integrated circuit die due to the thin and fragile nature of the electrical connections within the integrated circuit die. Instead, a system of conductive package leads is provided to access the external connections. The integrated circuit die is connected or bonded to the leads using thin and flexible wires or bond wires.

An integrated circuit package generally includes a protective housing, which surrounds the integrated circuit die. The protective housing is usually filled with a liquid potting mixture, or other encapsulant, which then hardens in situ. During the introduction of the liquid, however, the bond wires are susceptible to mid-line motion or "sweep". As the fill liquid is introduced across the wires from a given direction, the bond wires, which are parallel to the liquid flow, are minimally disturbed. However, the bond wires, which are perpendicular to (or across) the flow of the liquid, are easily bent out of position along the curve of the wires. Closely spaced adjoining bond wires can be "swept" into a position in which they touch. As the liquid fill material solidifies, the touching bond wires can provide a permanent short-circuit of the integrated circuit package, causing the integrated circuit package to fail.

A variety of approaches has been put forward to minimize or eliminate the bond wire "sweep". The direction of the fill material entry ("center gating" and "side gating", for example) has been varied to minimize sweep. Previous attempts with bonding patterns and systems have not provided an adequate bonding pattern to minimize shorting during fill processes. Specifically, prior art wire bonds tend to short during fill procedures when closely positioned adjacent wires touch.

The necessary bonding process also introduces potential short-circuit of the integrated circuit package. The bonding process creates bump balls on the leads that often extends beyond the leads to which the bump balls are attached. The bump balls are formed to attach the wire bonds to the package leads. The formation of the bump balls leaves a large deposition of the wire bond material on the package leads that tend to short with adjacent bump balls. The touching of adjacent bump balls can provide a permanent short-circuit of the integrated circuit package, causing the integrated circuit package to fail.

Thus, a need still remains for an integrated circuit package system to provide improved reliability and manufacturing yield with smaller features in a smaller area. In view of the increasing demand for improved density of integrated circuits and particularly portable electronic products, it is increasingly critical that answers be found to these problems.

Solutions to these problems have been long sought but prior developments have not taught or suggested any solutions and, thus, solutions to these problems have long eluded those skilled in the art.

DISCLOSURE OF THE INVENTION

The present invention provides providing a plurality of substantially identical package leads formed in a single row, and attaching bond wires having an offset on adjacent locations of the package leads.

Certain embodiments of the invention have other aspects in addition to or in place of those mentioned or obvious from the above. The aspects will become apparent to those skilled in

BEST MODE FOR CARRYING OUT THE INVENTION

Figure 1:
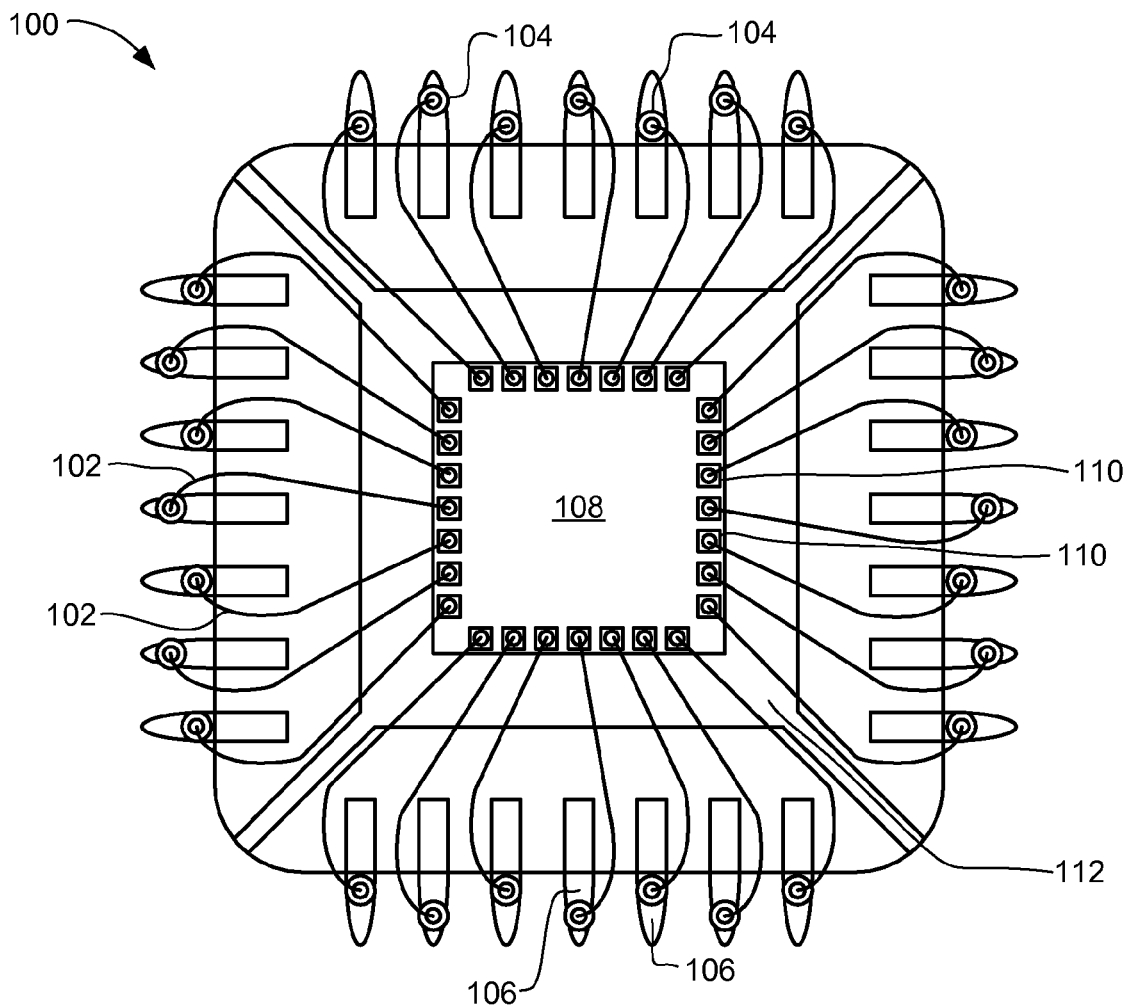
FIG. 1 is a top plan view of an integrated circuit package system in an embodiment of the present invention.

In the following description, numerous specific details are given to provide a thorough understanding of the invention. However, it will be apparent that the invention may be practiced without these specific details. In order to avoid obscuring the present invention, some well-known circuits, and process steps are not disclosed in detail.

Likewise, the drawings showing embodiments of the apparatus/device are semi-diagrammatic and not to scale and, particularly, some of the dimensions are for the clarity of presentation and are shown greatly exaggerated in the drawing FIGs. Similarly, although the sectional views in the drawings for ease of description show the invention with surfaces as oriented downward, this arrangement in the FIGs. is arbitrary and is not intended to suggest that invention should necessarily be in a downward direction. Generally, the device can be operated in any orientation. In addition, the same numbers are used in all the drawing FIGs. to relate to the same elements.

The term "horizontal" as used herein is defined as a plane parallel to the conventional plane or surface of the invention, regardless of its orientation. The term "vertical" refers to a direction perpendicular to the horizontal as just defined. Terms, such as "on", "above", "below", "bottom", "top", "side" (as in "sidewall"), "higher", "lower", "upper", "over", and "under", are defined with respect to the horizontal plane. The term "on" refers to direct contact among the elements.

The term "processing" as used herein includes deposition of material or photoresist, patterning, exposure, development, etching, cleaning, and/or removal of the material or photoresist as required in forming a described structure.

Referring now to FIG. 1, therein is shown a top plan view of an integrated circuit package system 100 in an embodiment of the present invention. The integrated circuit package system 100 includes bond wires 102, bump balls 104 of the bond wires 102 and package leads 106. The package leads are substantially identical and formed in a single row around a perimeter of the integrated circuit package system 100. The bond wires 102 are formed with a wire bonding process that forms the bump balls 104 of the bond wires 102 for electrical connection to the package leads 106. Generally, the bond wires 102 and the bump balls 104 can be formed along an outer portion or perimeter of the package leads. The bump balls 104 are formed in a zigzag pattern such that each of the bump balls 104 is formed in an offset or staggered location from an adjacent location of the bump balls 104. The bump balls 104 are positioned on the package leads 106 in alternating locations with respect to predetermined distances based on an extent of the package leads 106.

The bond wires 102 also provide electrical connection to an integrated circuit die 108 including bond pads 110. The bond pads 110 of the integrated circuit die 108 provide a connection surface for electrically connecting the bond wires 102 to the integrated circuit die 108. Circuitry on the integrated circuit die 108 is electrically connected to the bond pads 110 on the integrated circuit die 108. The bond wires 102 are connected through the wire bonding processes between the bond pads 110 and the bump balls 104 on the package leads 106. The package leads 106 provide electrical connection to a next level system, such as a printed circuit board or next level system. The integrated circuit package system 100 may optionally include a die paddle 112 for mounting the integrated circuit die 108.

For illustrative purposes, twenty-eight of the package leads 106 are shown in the integrated circuit package system 100 although it is understood that any number of the package leads 106 may be used. Further, for illustrative purposes, seven of the package leads 106 are shown on each side of the integrated circuit package system 100 although it is understood that the number of the package leads 106 on any side may different.

Figure 2:
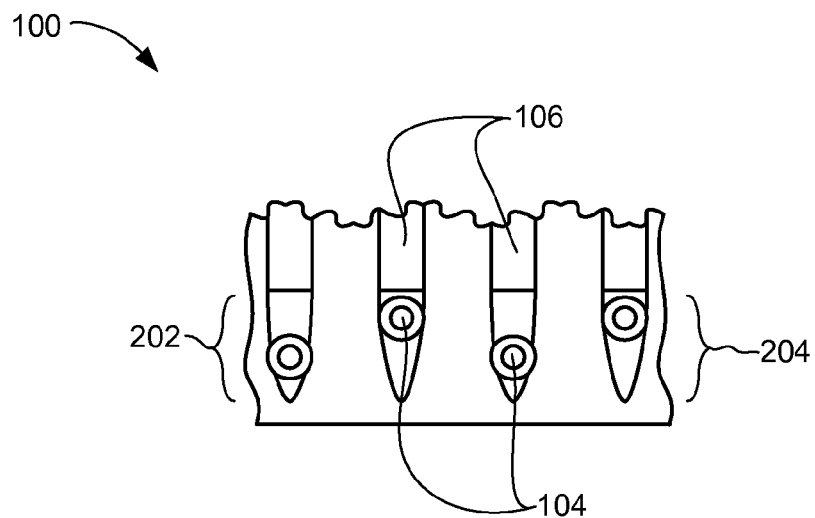
FIG. 2 is a top plan view of the integrated circuit package system in a bump-ball-forming phase.

Referring now to FIG. 2, therein is shown a top plan view of the integrated circuit package system 100 in a bump-ball-forming phase. The integrated circuit package system 100 includes the bump balls 104 formed on the package leads 106. The package leads 106 include a first bonding surface 202 and a second bonding surface 204. The first bonding surface 202 and the second bonding surface 204 provide surfaces for forming the bump balls 104 of the bond wires 102 of FIG. 1. The bump balls 104 can be formed across the extents of the first bonding surface 202 and the second bonding surface 204 to connect electrically the bond wires 102 to the package leads 106.

The bump balls 104 are formed in the zigzag pattern providing offsets from adjacent locations of the bump balls 104. A first alternating set of the bump balls 104 can be formed at a predetermined offset from an extent of the first bonding surface 202 of the package leads 106. A second alternating set of the bump balls 104 can be formed on the second bonding surface 204 at an offset from the first alternating set. Diameters of the bump balls 104 range in size with connection processes. The diameters of the bump balls 104 that are greater than a pitch of the package leads 106 maintain electrical integrity when formed in the zigzag pattern. It has been discovered that the integrated circuit package system 100 provides improved spacing between the bump balls 104.

For illustrative purposes, the bump balls 104 are shown without the bond wires 102 although it is understood that the bump balls 104 are formed connected to the bond wires 102. Further, for illustrative purposes four of the package leads 106 are shown although it is understood that any number of the package leads 106 may be used.

Figure 3:
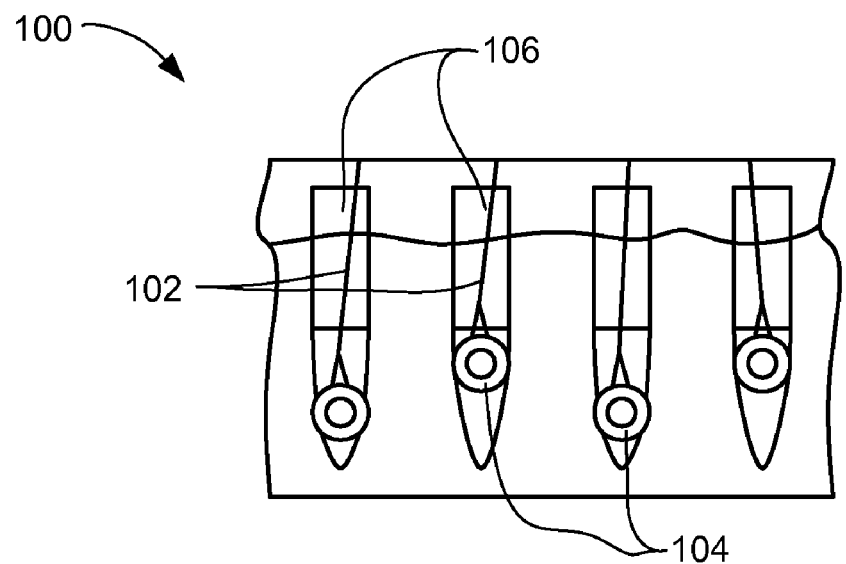
FIG. 3 is a top plan view of the integrated circuit package system in a wire-bonding phase.

Referring now to FIG. 3, therein is shown a top plan view of the integrated circuit package system 100 in a wire-bonding phase. The integrated circuit package system 100 includes the bond wires 102 formed by the wire bonding process to connect the package leads 106 to the bond pads 110 of FIG. 1 on the integrated circuit die 108 of FIG. 1. The bond wires 102 having the bump balls 104 connect to the package leads 106 in the zigzag pattern. The diameters of the bump balls 104 can be increased to a diameter greater than the pitch of the package leads 106 but less than the smaller of either the offset of the bump balls 104, or the width of the package leads 106 added to the combined spacing between each the package leads 106 in adjacent positions. It has been discovered that the integrated circuit package system 100 provides an improved size range of the bump balls 104.

For illustrative purposes the bond wires 102 are shown formed at an oblique angle with respect to the package leads 106 although it is understood that the bond wires 102 may be formed in any position. Further, for illustrative purposes, four of the package leads 106 are shown although it is understood that any number of the package leads 106 may be used.

Figure 4:
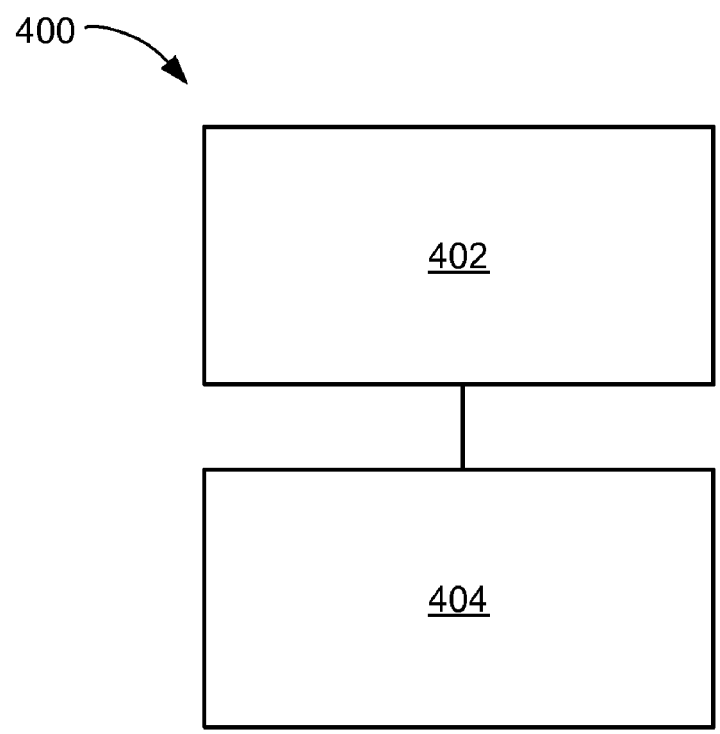
FIG. 4 is a flow chart of an integrated circuit package system for manufacturing the integrated circuit package system in an embodiment of the present invention.

Referring now to FIG. 4 is a flow chart of an integrated circuit package system 400 for manufacturing the integrated circuit package system 100 in an embodiment of the present invention. The system 400 includes providing a plurality of substantially identical package leads formed in a single row in a block 402; attaching bond wires having an offset on adjacent locations of the package leads in a block 404.

In greater detail, a method to fabricate the integrated circuit package system 100, in an embodiment of the present invention, is performed as follows:

1. Forming a plurality of substantially identical leads formed in a single row around a perimeter of the integrated circuit package system. (FIG. 1)
2. Bonding bond wires between an offset location on adjacent locations of package leads and an integrated circuit. (FIG. 1)

It has been discovered that the present invention thus has numerous aspects.

An aspect is that the present invention provides zigzag wire bonding. Wire bonding is performed on the package leads in a staggered, offset, or zigzag pattern. Each adjacent bond wire is attached at different locations on the package lead. The different locations are used in an alternating pattern with the wire bonding process.

It has been discovered that the disclosed structure provides improved bump ball spacing. The zigzag wire bonding provides offset or staggered bump balls. The bump balls are no longer next to adjacent bump balls. The spacing provided by the offset or stagger provides significantly increased spacing between the bump balls adjacent to one another.

It has also been discovered that the disclosed structure provides an improved range of sizes of the bump balls. The increased spacing between the bump balls provides additional area for each of the bump balls. The sizes of the bump balls can be significantly increased while maintaining appropriate spacing.

Yet another discovery of the disclosed structure is that it can be applied to any fine pitch lead. The zigzag wire bonding is not limited to specific lead types or lead configurations. The package leads do not require additional processing. The zigzag wire bonding improves spacing and size range for all package leads, particularly fine pitch leads.

Yet another discovery of the disclosed structure is that it allows improved package lead pitch. The zigzag wire bonding also provides improved spacing for smaller package lead pitch or spacing. The smaller package lead spacing allows more package leads within the same area or smaller overall package dimensions.

Yet another discovery of the disclosed structure is that it provides an offset or stagger to the bond wires. Some of the bond wires can be shorter due to the offset, further reducing the bond wire loop. The offset of one end of the bond wires offsets or staggers the bond wire loop such that the bond wire loop not directly adjacent to adjacent bond wires.

Yet another discovery of the disclosed structure is that it reduces bond wire shorting. The offset of the bond wires provides increased spacing between the bond wires reducing wire shorting. Reducing lengths of the bond wires due to the offset also increases spacing between the bond wires thereby reducing bond wire shorting.

These and other valuable aspects of the present invention consequently further the state of the technology to at least the next level.

Thus, it has been discovered that the integrated circuit package system method and apparatus of the present invention furnish important and heretofore unknown and unavailable solutions, capabilities, and functional aspects. The resulting processes and configurations are straightforward, cost-effective, uncomplicated, highly versatile, and effective, can be implemented by adapting known technologies, and are thus readily suited for efficient and economical manufacturing.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations, which fall within the scope of the included claims. All matters hitherto fore set forth herein or shown in the accompanying drawings are to be interpreted in an illustrative and non-limiting sense.

The invention claimed is:

1. A method of manufacture of an integrated circuit package system comprising:
   providing a plurality of substantially identical package leads formed in a single row; and
   attaching bond wires having an offset on adjacent locations only along an outer portion of the package leads.

2. The method as claimed in claim 1 wherein attaching the bond wires comprises attaching the bond wires between the package leads and an integrated circuit.

3. The method as claimed in claim 1 wherein attaching the bond wires comprises attaching the bond wires in a staggered pattern.

4. The method as claimed in claim 1 wherein providing the package leads comprises providing a predetermined spacing between package leads for a size of a bump ball.

5. The method as claimed in claim 1 wherein providing the package leads comprises providing a predetermined spacing between package leads for adjacent bump balls.

6. A method of manufacture of an integrated circuit package system comprising:
   forming a plurality of substantially identical package leads formed in a single row around a perimeter of the integrated circuit package system; and
   bonding bond wires between an offset location on adjacent locations only along an outer portion of the package leads and an integrated circuit.

7. The method as claimed in claim 6 wherein bonding the bond wires comprises bonding the bond wires between the package leads and an integrated circuit die bond pad.

8. The method as claimed in claim 6 wherein bonding the bond wires comprises forming bump balls on the package leads.

9. The method as claimed in claim 6 wherein bonding the bond wires comprises forming bump balls in a zigzag pattern.

10. The method as claimed in claim 6 wherein forming the package leads comprises forming a leadframe.

11. An integrated circuit package system comprising:
    a plurality of substantially identical package leads formed in a single row; and
    bond wires having an offset on adjacent locations only along an outer portion of the package leads.

12. The system as claimed in claim 11 wherein the bond wires comprise the bond wires between the package leads and an integrated circuit.

13. The system as claimed in claim 11 wherein the bond wires comprise the bond wires in a staggered pattern.

14. The system as claimed in claim 11 wherein the package leads comprise a predetermined spacing between package leads for a size of a bump ball.

15. The system as claimed in claim 11 wherein the package leads comprise a predetermined spacing between package leads for adjacent bump balls.

16. The system as claimed in claim 11 wherein:
the plurality of substantially identical package leads formed in a single row around a perimeter of the integrated circuit package system; and
the bond wires on adjacent package leads having an offset from one another for additional spacing between bump balls of the bond wires.

17. The system as claimed in claim 16 wherein the bond wires comprise the bond wires between the package leads and an integrated circuit die bond pad.

18. The system as claimed in claim 16 wherein the bond wires comprise bump balls on the package leads.

19. The system as claimed in claim 16 wherein the bond wires comprise bump balls in a zigzag pattern.

20. The system as claimed in claim 16 wherein the package leads comprise a leadframe.

\* \* \* \* \*